United States Patent
Hunter et al.

(10) Patent No.: US 7,684,264 B2
(45) Date of Patent: Mar. 23, 2010

(54) MEMORY SYSTEM WITH RAM ARRAY AND REDUNDANT RAM MEMORY CELLS HAVING A DIFFERENT DESIGNED CELL CIRCUIT TOPOLOGY THAN CELLS OF NON REDUNDANT RAM ARRAY

(75) Inventors: Bradford L. Hunter, South Burlington, VT (US); James D. Burnett, Austin, TX (US); Andrew C. Russell, Austin, TX (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 372 days.

(21) Appl. No.: 11/627,445

(22) Filed: Jan. 26, 2007

(65) Prior Publication Data

US 2008/0181034 A1  Jul. 31, 2008

(51) Int. Cl.
*G11C 7/00* (2006.01)
(52) U.S. Cl. .............. 365/189.2; 365/200; 365/156; 365/154; 365/51; 365/63; 365/72
(58) Field of Classification Search ............ 365/230.03, 365/149, 156, 154, 200, 51, 63, 72, 189.2
See application file for complete search history.

(56) References Cited

U.S. PATENT DOCUMENTS

| | | | |
|---|---|---|---|
| 6,725,346 B1 | 4/2004 | Ganesh et al. | |
| 6,901,015 B2 | 5/2005 | Shinohara | |
| 7,012,844 B2* | 3/2006 | Yoon | 365/200 |
| 7,360,144 B2* | 4/2008 | Kang et al. | 714/764 |
| 7,405,973 B2* | 7/2008 | Park | 365/185.09 |
| 2002/0044489 A1 | 4/2002 | Kim | |
| 2004/0088612 A1 | 5/2004 | Seong | |
| 2005/0041491 A1 | 2/2005 | Kyung | |
| 2006/0023524 A1 | 2/2006 | Konishi | |

* cited by examiner

*Primary Examiner*—Andrew Q Tran
(74) *Attorney, Agent, or Firm*—David G. Dolezal; Joanna G. Chiu

(57) ABSTRACT

A memory system including a random access memory (RAM) array and a corresponding redundant RAM array which stores information redundant to the RAM array, where a designed cell circuit topology of cells within the redundant RAM array differs from a designed cell circuit topology of cells within the RAM array. The redundant RAM array is selectively accessed when accessing the RAM array to store data to the redundant RAM array for failed cells of the RAM array.

20 Claims, 4 Drawing Sheets

MEMORY SYSTEM WITH RAM ARRAY AND REDUNDANT RAM MEMORY CELLS HAVING A DIFFERENT DESIGNED CELL CIRCUIT TOPOLOGY THAN CELLS OF NON REDUNDANT RAM ARRAY

BACKGROUND OF THE INVENTION

1. Field of the Invention

This invention relates in general to a RAM memory system and more specifically to a memory system with redundant RAM memory cells.

2. Description of the Related Art

A RAM memory system can be utilized to store data during the operation of a system utilizing the RAM memory system. Examples of a RAM memory system include a cache in a data processor and a RAM memory system in a data processing system such as a computer system or other types of data communications system.

In some memory systems, the memory cells of a RAM are arranged in an array of rows and columns. Access to the cells is made by providing address bits to row and column decoder circuitry.

Some RAM memory systems implement a redundant array of memory cells for storing data if a cell or cells of the main RAM array are determined to be failing or deficient (failed). These redundant cells, when implemented on the same integrated circuit, have the same designed cell circuit configuration as the cells of the main array.

What is needed is an improved memory system.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
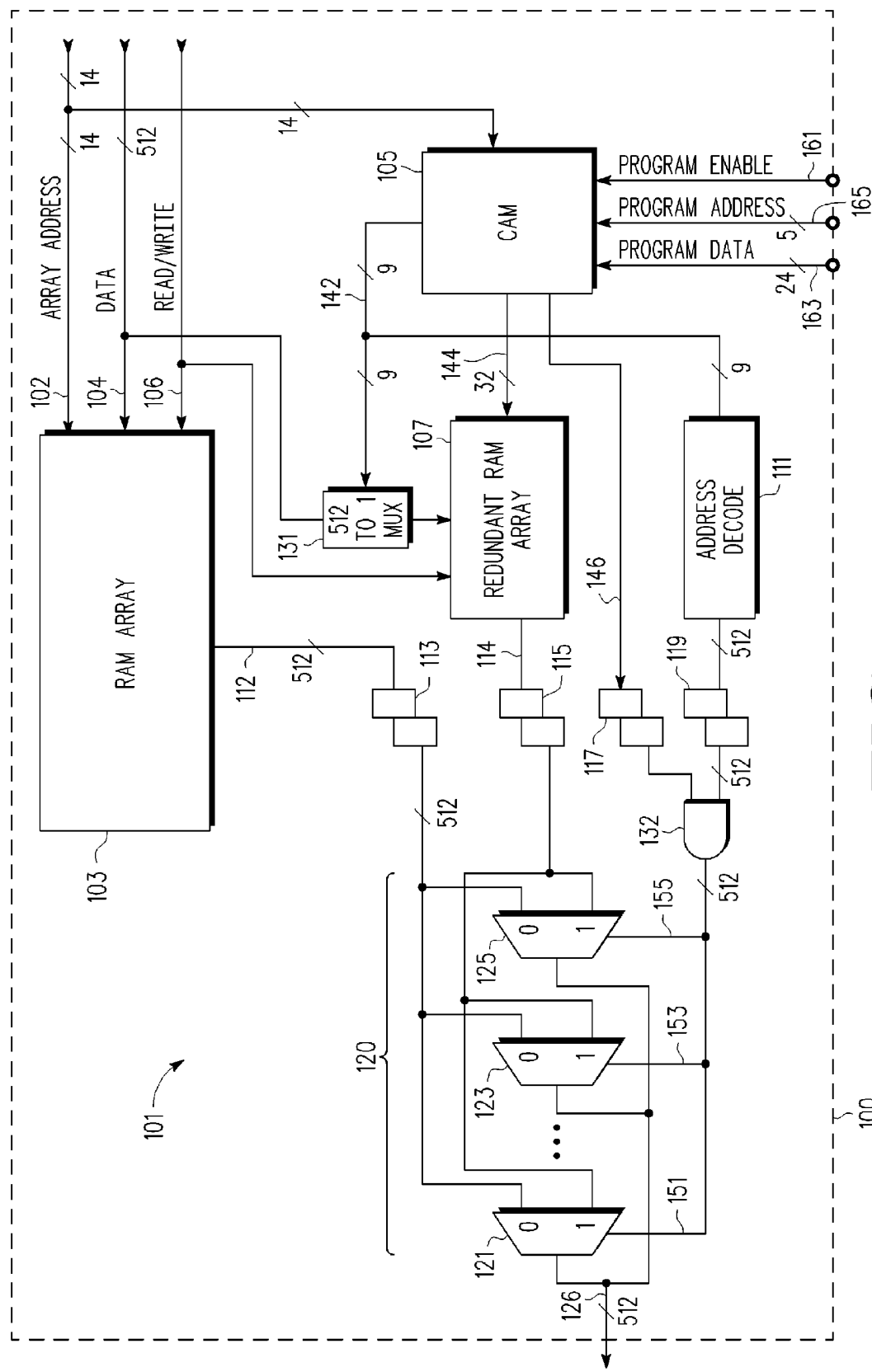
FIG. 1 is a block diagram of a RAM memory system according to one embodiment of the present invention.

FIG. 1 sets forth one embodiment of a RAM memory system that includes a RAM memory array and a redundant RAM memory array according to the present invention.

Memory system 101 includes a RAM array 103 and a redundant RAM array 107. Array 103 includes RAM cells of a designed cell circuit topology and array 107 includes RAM cells of a different designed cell circuit topology.

Array 103 includes an array of RAM cells (not shown in FIG. 1) arranged in rows and columns. Array 103 also includes access circuitry including column decoders, row decoders, control circuitry, and sense amplifiers (not shown) for writing to and reading data from the cells of array 103. In one embodiment, array 103 includes static RAM (SRAM) cells of a 6 transistor (6T) configuration. However, in other embodiments, array 103 may include other types of RAM cells such as 8T, 10T, or 12T SRAM cells, dynamic RAM (DRAM) cells, magneto resistive RAM (MRAM), or thyristor RAM (TRAM) cells. In one embodiment, array 103 includes a mega byte of cells, but may include a different number of cells in other embodiments.

Data is written and read from array 103 by proving an address on address lines 102. Data for a write operation to array 103 is provided on data lines 104. The data is written to the cells of array 103 addressed by the address provided on lines 102 and by placing the read/write line 106 is a write state. In one embodiment, system 101 includes 14 address lines and 512 data lines, but may have a different number of address and/or data lines in other embodiments. Data is read from array 103 by providing an address on lines 102 and placing the read/write line 106 in a read state.

Memory system 101 includes a redundant RAM array 107 of memory cells for storing data for failed cells of array 103. In the embodiment shown, array 107 includes 32 memory cells. The RAM cells of array 107 have a different designed cell circuit topology than the cells of array 103. In one embodiment, the cells of array 103 are 6T SRAM cells and the cells of array 107 are 8T SRAM cells. In another embodiment, the cells of array 103 maybe DRAM or MRAM cells and the cells of array 107 maybe 6T, 10T, 12T, or other types of RAM cells different from the cells of array 103.

Memory system 101 includes access circuitry for writing and reading to array 107. In the embodiment shown, a content addressable memory (CAM) 105 is utilized to detect addresses on lines 102 that include detected failed cells of array 103. However, in other embodiments, other types of circuitry may be utilized to detect addresses of failed cells whose information is stored in a redundant array In one embodiment, CAM 105 is a 32 bit entry, 24 bit fuse programmable CAM. However, CAMs of other characteristics may be used in other embodiments. In the embodiment shown, each entry of CAM 105 includes a 14 bit address search field, and a return field associated with the 14 bit address field that includes a 1 bit enable field and a 9 bit location indication address field. RAM array 107 may include other access circuitry (e.g. sense amplifiers) not shown in FIG. 1.

CAM 105 includes a 32 bit output provided on lines 144 for providing a location indicator to RAM array 107 to indicate which cell in RAM array 107 a data bit is to be stored or read that corresponds to the address provided on lines 102. In one embodiment, the location indicator is a decoded address having 32 lines, where each line corresponds to an entry in CAM 105. In response to a CAM hit, the line that corresponds to the CAM entry that generated the CAM hit would be at a high state with the other lines of the indicator being at a low state. In other embodiments, the location indicator would be an encoded address where CAM 105 would include an encoder and RAM array 107 would include a decoder.

In the embodiment shown, RAM array 107 is capable of storing one bit of redundant information for a cache line of 512 data bits (the number of bits stored at the address provided on address lines 102) of array 103. The position of the 1 bit within the 512 data bits is provided by the 9 bits of lines 142 from CAM 105 that are associated with the entry that generated the CAM hit. The 9 bit location indication address of lines 142 is provided to multiplexer 131 to select which bit of the 512 data bits of data lines 104 is provided to RAM array 107 during a write operation. Also, the location indication address is provided to address decoder 111 for generating 512, one bit control signals (via 512 AND gates 132 and 512 latches 119) to select which one of the 512 data bits of the output of array 103 is replaced by the output of redundant RAM array 107. The 512 AND gates 132 each have an input coupled to receive a CAM hit signal from CAM 105 via line 146 and latch 117. The outputs of the 512 AND gates 132 are used as control signals to the 512 multiplexers 120 (with multiplexers 121, 123, and 125 shown in FIG. 1) to determine whether an output data bit of RAM array 103 or the output of RAM array 107 is provided on each of the 512 output data lines 126. If there is a CAM hit on a read operation, one of the 512 multiplexers 120 will provide the output of redundant RAM array 107 at its output and each of the other 511 multiplexers 120 will provide a data bit from RAM array 103 via the an associated data line of lines 112 and latch of latches 113.

In one embodiment, array 103 may be organized with interleaved bit columns. In other embodiments, array 103 may have multiple sub arrays. In some embodiments, each sub array has a corresponding redundant array 107 along with a corresponding CAM (or other type of failed address detector circuit). Still in other embodiments, system 101 may include other redundant arrays and corresponding CAMs to provide for more than one redundant cell per cache line (e.g. 512 bits in the embodiment shown). In other embodiments, a cache line of array 103 may be of a different number of bits (e.g. other than 512).

In the embodiment shown, RAM array 107 includes only one cell per address lines 102. However in other embodiments, array 107 may contain a number of cells greater than one for each address. For example, in some embodiments, RAM array 107 may contain e.g. 2, 4, 8, 16, 32, 64 128, or 256 cells per address. Still in other embodiments, an cache line of 512 bits associated with the address of lines 102 may be stored in RAM array 107 for each address. In such an embodiment, a row in RAM array 107 would be redundant to an entire row of array 103. In such an embodiment, address decoder 111, multiplexer 131, and the indication address of lines 142 may not be necessary. In another embodiment, a column in RAM array 107 may be redundant to a column in array 103. In yet another embodiment, RAM array 107 maybe redundant to a subarray of array 103.

In other embodiments, array 103 may include redundant rows and redundant columns (not shown). In one embodiment, the cells of the redundant rows and redundant columns would have the same designed cell circuit topology as the other cells in array 103. In one embodiment, the memory cells of array 107 may be physically located adjacent to or within the rows and columns of cells of array 103. For example, array 107 maybe a column of memory cells physically located as an end column of array 103 or a row of memory cells physically located as an end row of array 103.

Figure 2:
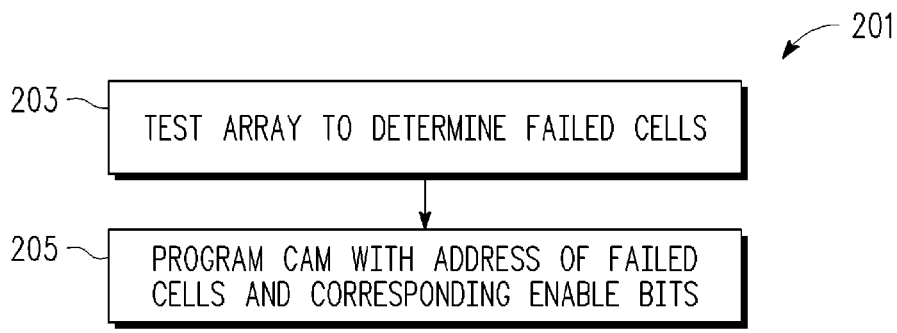
FIG. 2 is a flow diagram setting forth one embodiment of a method for determining a failed memory cell of a RAM array according to the present invention.

FIG. 2 is flow diagram showing how a determination of failed cells of array 103 is made and how the addresses of the failed cells are loaded into CAM 105.

In 203, array 103 is tested to determine which cells have failed. In one embodiment, the array is tested during manufacture. In one embodiment, a cell is determined to have failed if an expected value is not provided during read and write tests. The addresses (e.g. 23 bit addresses) for each failed cell of array 103 are obtained during testing.

In 205, CAM 105 is programmed with the 23 bit addresses of the failed cells of array 103. Also, each entry of CAM 105 has an enable bit that is set when the entry is programmed with an address of a failed cell. Referring back to FIG. 1, integrated circuit 100 includes programming lines for programming the contents of CAM 105 with the failed cell addresses and enable bits. In other embodiments, CAM 105 may be programmed by circuitry located on integrated circuit 100 (e.g. a processor circuit not shown in FIG. 1).

In the embodiment of FIG. 1, system 101 includes 24 bit lines 163 for conveying the 23 bit address of the failed memory cell and the enable bit, 5 program address lines 165 for conveying the address of the entry line in CAM 105 to be programmed, and a program enable line 161 for conveying a signal to program CAM 105. In one embodiment, the addresses of the failed memory cells are loaded in the entries of CAM 105 from the lowest to highest address (or vice versa). 14 of the 23 address bits are loaded to the search field of an entry and 9 bits of the 23 address bits are loaded to a return field of the entry. In one embodiment, CAM 105 is programmed by selectively blowing fuses.

Figure 3:
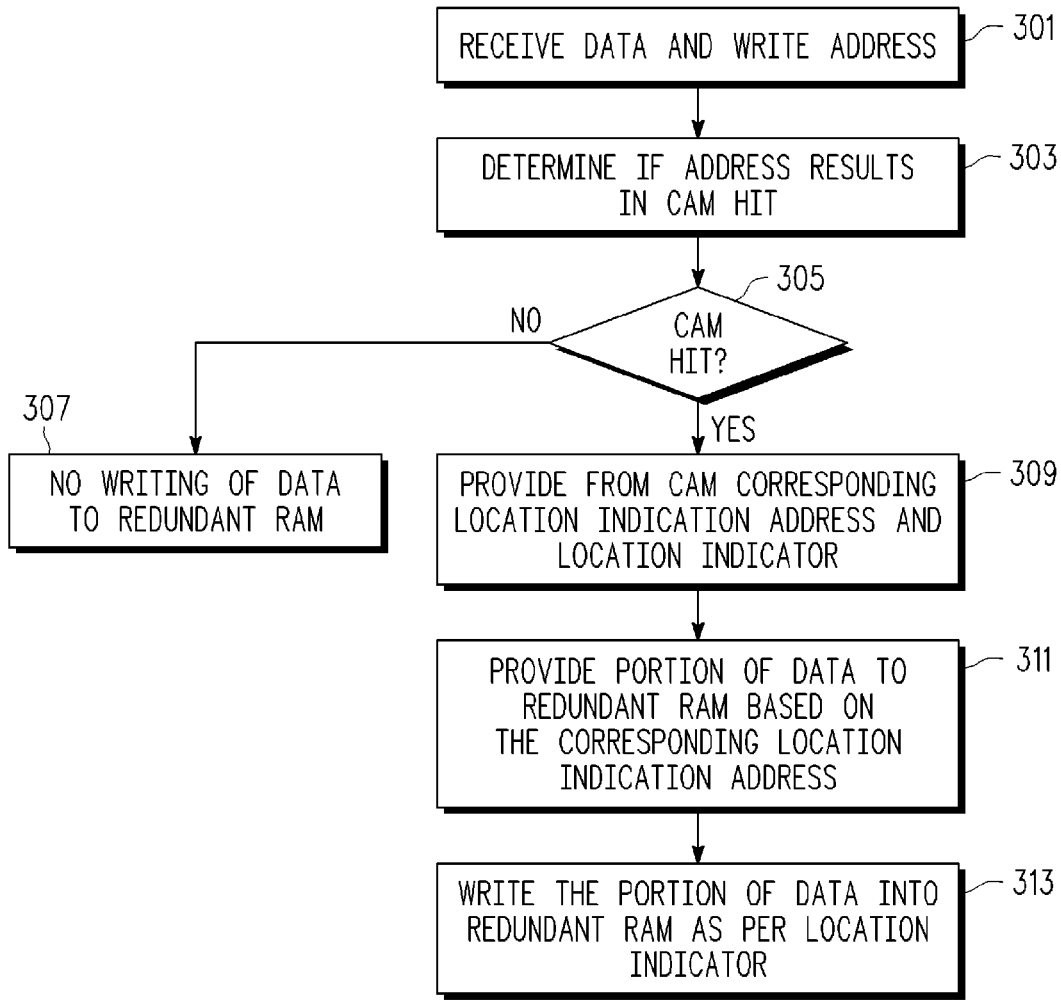
FIG. 3 is a flow diagram setting forth one embodiment of a method for writing data into a memory system according to the present invention.

FIG. 3 is a flow diagram of one embodiment for writing data to memory system 101. In 301, data received on lines 104 is provide to system 101 (e.g. from a processor not shown) to be written to a location of array 103 as conveyed on address lines 102. Also, the read/write line 106 is asserted to the write state. In 303, a determination of whether the write address on lines 102 conveys an address of a failed memory cell of array 103. In one embodiment, this determination is made by determining whether the address on lines 102 matches the 14 bits in the search field of any entry of CAM 105 (referred to as a CAM hit). If there is no CAM hit in 305, then no data is written to array 107 in 307, and all data is written to array 103.

If there is a CAM hit in 305, then in 309 the location indication address is provided as select lines to multiplexer 131 via lines 142. In one embodiment, the nine bits of the location indication address are the 9 least significant bits of the address of the failed cell of RAM array 103. The 9 bit location indication address selects which one of the 512 bits received on lines 104 is to be stored in RAM array 107 via the output of multiplexer 131 in operation 311. Also in 309, the 32 bit location indicator is provided from CAM 105 to RAM array 107 via lines 144 to determine the location of where the bit from the output of multiplexer 131 is to be stored in array 107 in operation 313. In one embodiment, the 32 bit location indicator is a decoded address that corresponds to the entry of CAM 105 that generated the CAM hit.

Figure 4:
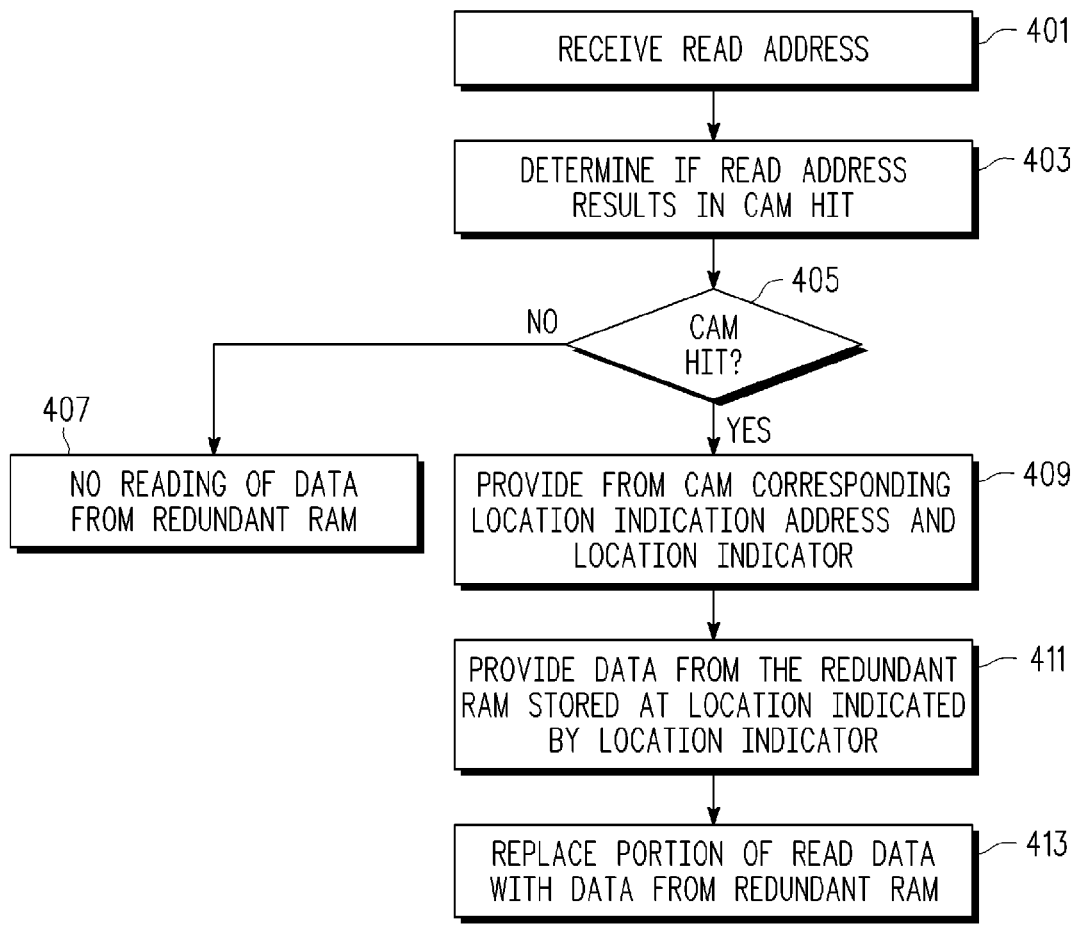
FIG. 4 is a flow diagram setting forth one embodiment of a method for reading data from a memory system according to the present invention.

FIG. 4 is a flow diagram for reading data from memory system 101 accordingly to one embodiment. In operation 401, a read address is received to read data at a location of array 103. In one embodiment, the read address is received from a processor (not shown) on address lines 102. Also in operation 401, the read/write line 106 is set to the read state. In 403, a determination is made of whether the read address on lines 102 conveys an address of a failed memory cell. In the embodiment shown, this determination is based on whether the address on lines 102 matches the 14 bit search field of any entry in CAM 105 (referred to as a CAM hit). If there is no CAM hit in 405, then no data is read from array 107 in 407 (and all data provided is from array 103). If there is a CAM hit in 405, in 409 CAM 105 provides the RAM location indicator to RAM array 107 and provides the 9 bit location indication address to address decoder 111.

In operation 411, the data from RAM array 107 at the location indicated by the location indicator is outputted from RAM array 107 on line 114 and provided via latch 115 to each "1" input of the 512 multiplexers 120.

In operation 413, the data bit outputted from RAM array 107 replaces the data bit from the failed memory cell of array 103. In one embodiment, the data bit from RAM output line 114 is provided to the "1" input of each multiplexer of the 512 multiplexers 120. The "0" inputs to multiplexers 120 are each coupled to a corresponding output line of output lines 112 of RAM array 103 via latches 113. The select line (e.g. select lines 151, 153, and 155) to the multiplexer of multiplexers 120 that provides the replacement bit from array 107 is set to a high state by address decoder 111 from the decoding of the 9 bit location indication address. Placing the select line high of the one multiplexer couples the output of latch 115 to the output of that multiplexer to provide the replacement bit on a line of lines 126 corresponding to that multiplexer. The other select lines of multiplexers 120 are set low to couple the output lines 112 to lines 126 for the other bits that are not being replaced.

In the embodiment of FIG. 1, RAM array 103 includes cells of a specific designed cell circuit topology and redundant RAM array 107 includes cells of a different designed cell circuit topology.

Figure 5:
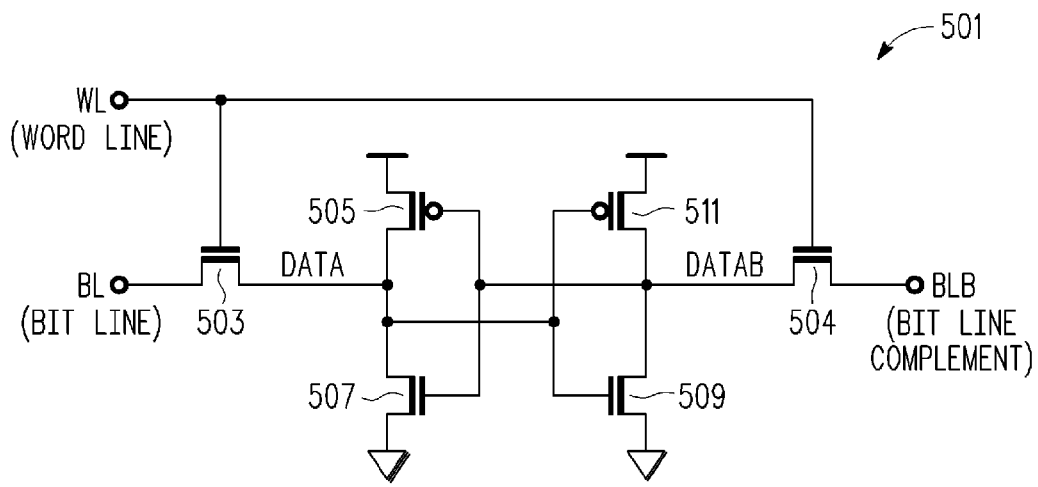
FIG. 5 is a circuit diagram of one embodiment of a RAM cell.
Figure 6:
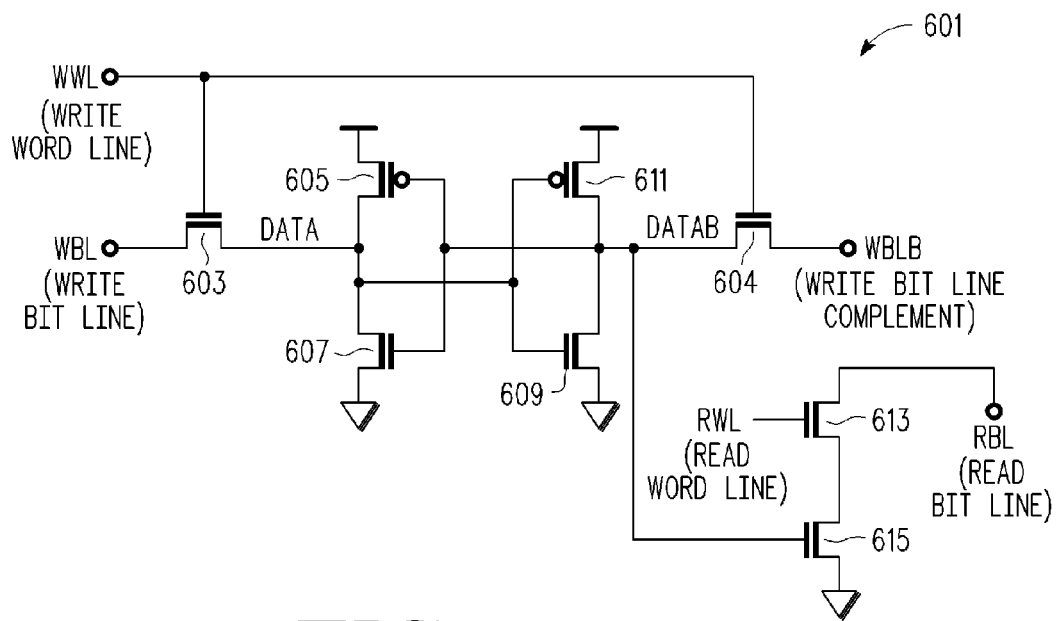
FIG. 6 is a circuit diagram of another embodiment of a RAM cell.
Figure 7:
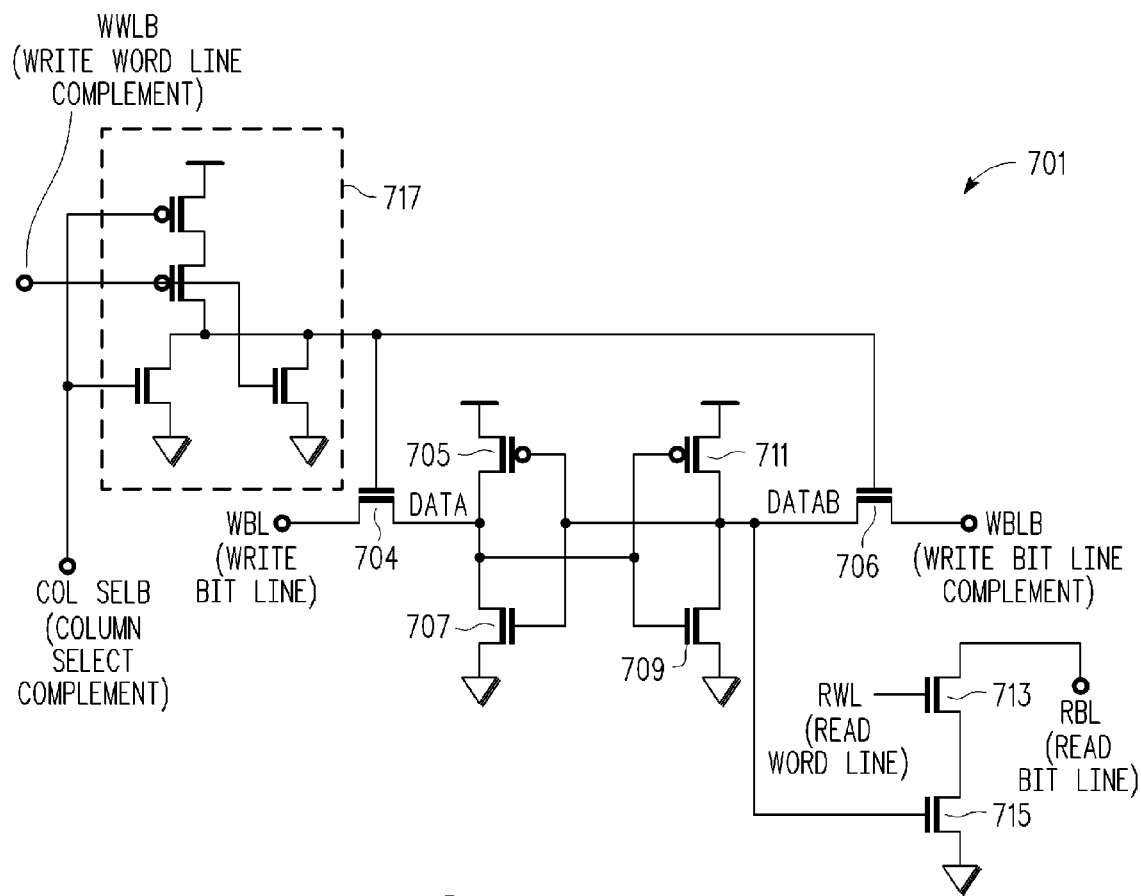
FIG. 7 is a circuit diagram of another embodiment of a RAM cell.

One example of cells having different designed cell circuit topologies includes memory cells having a different number of transistors. FIGS. 5, 6, and 7 are circuit diagrams of examples of a 6 transistor (6T) SRAM memory cell, an 8 transistor (8T) SRAM memory cell, and a 12 transistor (12T) SRAM memory cell, respectively. Each of these cells have a different designed cell circuit topology from each other in that they have a different number of transistors.

Regarding FIG. 5, 6T memory cell 501 includes a pair of cross coupled inverters made of transistors 505, 507, 511, and 509. The cross coupled inverters are coupled to a bit line (BL) and bit line complement (BLB) via pass gate transistors 503 and 504 respectively. The control gates of transistors 503 and 504 are coupled to word line (WL). Other types of 6T memory cells may have other configurations in other embodiments.

Regarding FIG. 6, 8T memory cell 601 includes a pair of cross coupled inverters (made of transistors 605, 607, 611, and 609) that are coupled to write bit line (WBL) and write bit line complement (WBLB) via pass gate transistors 603 and 604, respectively. The gates of pass gate transistors 603 and 604 are coupled to a write word line (WWL). Cell 601 includes read bit line pull down transistors 613 and 615 for reading the data of cell 601. The gate of transistor 613 is coupled to a read word line (RWL) and the drain of transistor 613 is coupled to a read bit line (RBL).

Cell 601 is considered a more robust cell in that read disturb is not a problem in 8T cell 601 as with 6T cell 501 due to the separate use of read bit lines and write bit lines. However, cell 601 incurs the penalty of extra transistors and bit line, thereby taking up additional integrated circuit space.

In one embodiment, the cells of array 103 are 6T cells (similar to cell 501) and the cells of array 107 are 8T cells (similar to cell 601). Accordingly, redundant array 107 is implemented with more robust memory cells. One advantage that may occur with implementing a redundant array with more robust memory cells is that it may allow for a faster read of the redundant memory cells. This faster read may allow time for the additional circuitry (e.g. CAM 105, multiplexer 131) to operate to provide redundant data. Accordingly, memory system 101 may provide redundancy without incurring a reduction in speed or may have a reduced reduction in speed.

Furthermore, providing a redundant array with a more robust memory cell may provide extra reliability for memory system 101 against the potential failure of the redundant memory cell.

Furthermore, by using the space saving 6T cell for the main array 103 instead of an 8T cell, integrated circuit area may be reduced.

Providing an array with single cell redundancy may allow for a memory system to operate successfully at a lower voltage than a memory system without a single cell redundant array. In some embodiments, random read and write cell variation increases as the operating voltage decreases (especially for an array with some types of 6T cells or other types of high density cells). Providing a redundant array of individually addressed memory cells allows for memory system 101 to be more tolerant of increased failure due to this variation in that the random failure of cells of array 103 can be replaced. Providing a redundant array having cells of a different designed cell circuit topology may allow for the redundant array to be more reliable at the lower voltages.

FIG. 7 is a circuit diagram of a 12T memory cell 701. Cell 701 includes cross coupled inverters (made of transistors 705, 707, 711, and 709). Like cell 601 of FIG. 6, cell 701 includes a separate read bit line (RBL) and write bit lines WBL and WBLB. In addition, cell 701 includes a NOR gate 717 that is coupled to the gates of pass gate transistors 704 and 706. NOR gate 717 has inputs to write word line complement (WWLB) and to a column select complement (COL SELB) line. The NOR gate enables cell selection to allow only selected cells to be written while unselected bits retain state. However, it has greater number of transistor and lines, and accordingly takes up more space. In one embodiment, array 103 includes either 8T cells (similar to cell 601) or 6T cells (similar to cell 501) and array 107 includes 12T cells (similar to cell 701).

Providing memory arrays with different transistor cell numbers may advantageously allow a memory system to implement arrays with different designed cell circuit topologies with different robustness in cell operation while providing a greater flexibility in cell design of different designed cell circuit topologies.

Using cells of different transistor numbers is one example of cells with different designed cell circuit topologies. Another example of cells with different designed cell circuit topologies includes memory cells with the same number of transistors but having a different interconnectivity of the transistors of the cells. For example, referring to FIG. 7, NOR gate 717 may be replaced with a NAND gate and N-Channel transistors 704 and 706 may be replaced with P-Channel transistors.

Another example of cells with different designed cell circuit topologies may be two cells that are powered by two different power supply voltages. For example, array 103 may be powered by a 0.7 volt power supply (not shown) and array 107 may be powered by a 1.1 V power supply (not shown). Providing a redundant array with a higher supply voltage may allow for the array to operate more quickly and reliably without increasing the area of the redundant array due to the additional transistors as with the embodiments of FIGS. 6 and 7. Furthermore, it allows the larger array 103 to operate at a lower voltage to save power.

Another example of cells with different designed cell circuit topologies are two cells that include corresponding transistors with different transistor parameters. Examples of transistor parameters include transistors with different effective lengths and/or different effective widths of their channels. For example, in one embodiment, array 103 would include 6T cells having transistors of a first width and length and array 107 would include 6T cells of the same interconnectivity but with at least one transistor having a different effective length and/or width to provide a cell that's more impervious to manufacturing variation, thereby increasing reliability. In one specific example, transistor 505 of cell 501 would be of one effective width and corresponding transistor 605 of cell 601 would be of a greater effective width.

Another example of a different transistor parameter includes having correspondingly located transistors of different conductivity types (e.g. P-Channel and N-Channel), different voltage thresholds (e.g. different gate dielectric thickness or different channel doping densities), and/or different transistor types (e.g. planar transistor versus MIGFet transistor). In one embodiment, the cells of memory array 107 would include at least one transistor of lower voltage thresholds than a corresponding transistor of the cells of memory array 103 to provide for more reliability and faster operating speeds.

In some embodiments, the different designed cell circuit topologies may include multiples differences e.g. including having both a different number of transistors and different threshold voltages.

In one embodiment, a method includes providing an integrated circuit including a first random access memory (RAM) array and a second RAM array. The second RAM array includes memory cells that are redundant to memory cells of the first RAM array. The first RAM array includes a first plurality of memory cells and the second RAM array includes a second plurality of memory cells. The memory cells of the first plurality are of a first designed cell circuit topology and the memory cells of the second plurality are of a second designed cell circuit topology. The first designed cell circuit topology is different from the second designed cell circuit topology. The method also including selectively accessing the second RAM array when accessing the first RAM array to store data to the second RAM array.

In another embodiment, a method of operating a memory system includes providing an integrated circuit having a random access memory (RAM) array and a redundant RAM array. A designed cell circuit topology of cells within the redundant RAM array differs from a designed cell circuit topology of cells within the RAM array. The method also includes receiving a RAM array write address indicating a location in the RAM array, receiving data corresponding to the RAM array write address, and storing at least a portion of the received data in the redundant RAM array if the received RAM array write address addresses at least one failed memory cell of the RAM array.

In another embodiment, an integrated circuit includes a first RAM array including a first plurality of memory cells having a first designed cell circuit topology. The first RAM array including inputs coupled to address lines to receive an array address for accessing memory cells of the first RAM array. The integrated circuit includes a second RAM array including a second plurality of memory cells having a second designed cell circuit topology different than the first designed cell circuit topology. The integrated circuit also includes access circuitry coupled to the second RAM array. The access circuitry includes circuitry which determines when a location in the first RAM array indicated by a received array address includes at least one failed memory cell, and in response to such a determination, the access circuitry accesses at least one memory cell of the second RAM array for providing redundancy for the at least one failed memory cell of the first RAM array.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:

powering an integrated circuit including a first random access memory (RAM) array and a second RAM array, the second RAM array including memory cells that are redundant to memory cells of the first RAM array, wherein the first RAM array includes a first plurality of memory cells and the second RAM array includes a second plurality of memory cells, wherein the memory cells of the first plurality are of a first designed cell circuit topology and the memory cells of the second plurality are of a second designed cell circuit topology, wherein the first designed cell circuit topology is different from the second designed cell circuit topology, wherein the first designed cell circuit topology includes the cells of the first plurality being powered by a first power supply voltage and the second designed cell circuit topology includes memory cells of the second plurality being powered by a second power supply voltage, wherein the second power supply voltage is greater than the first rower supply voltage, wherein the second designed cell circuit topology includes a same number of transistors as the first designed cell circuit topology; and selectively accessing the second RAM array when accessing the first RAM array to store data to the second RAM array.

2. The method of claim 1, wherein the second designed cell circuit topology includes a different interconnectivity of transistors than the first designed cell circuit topology.

3. The method of claim 1, wherein the first designed cell circuit topology includes at least one transistor having a first effective width and the second designed cell circuit topology includes at least one corresponding transistor having a second effective width different from the first effective width.

4. The method of claim 1, wherein the first designed cell circuit topology includes at least one transistor having a first effective length and the second designed cell circuit topology includes at least one corresponding transistor having a second effective length different from the first effective length.

5. The method of claim 1, wherein the first designed cell circuit topology includes at least one transistor having a first threshold voltage and the second designed cell circuit topology includes at least one corresponding transistor having a second threshold voltage different from the first threshold voltage.

6. The method of claim 1, further comprising:

accessing the first RAM array for data stored in the first RAM array in response to a read request;

selectively accessing the second RAM array when accessing the first RAM array in response to the read request to provide data from the second RAM array;

combining the data from the second RAM array with data from the first RAM array to form a unit of data;

providing the unit of data on output data lines.

7. The method of claim 1 wherein:

the selectively accessing the second RAM array when accessing the first RAM array to store data includes accessing the second RAM array if the accessing the first RAM array includes accessing at least one failed memory cell of the first RAM array.

8. The method of claim 1 wherein the memory cells of the first plurality of memory cells and the second plurality of memory cells each include a pair of cross coupled inverters, a first pass gate transistor for coupling the pair of cross coupled inverters to a first bit line which is used for writing data to the cell, and a second pass gate transistor for coupling the pair of cross coupled inverters to a second bit line which is used for writing data to the cell, wherein the second bit line is a complementary bit line to the first bit line.

9. The method of claim 1 wherein the same number of transistors is 6.

10. A method of operating a memory system comprising:
powering an integrated circuit having a random access memory (RAM) array and a redundant RAM array, wherein the powering includes powering a first plurality of cells within the redundant RAM array at a first power supply voltage and powering a second plurality of cells of the RAM array at a second power supply voltage that is less than the first power supply voltage, wherein the cells of the first plurality and the second plurality each include a pair of cross coupled inverters, a first pass gate transistor for coupling the pair of cross coupled inverters to a first bit line which is used for writing data to the cell, and a second pass gate transistor for coupling the pair of cross coupled inverters to a second bit line which is used for writing data to the cell, wherein the second bit line is a complementary bit line to the first bit line;
receiving a RAM array write address indicating a location in the RAM array;
receiving data corresponding to the RAM array write address; and
storing at least a portion of the received data in the redundant RAM array if the received RAM array write address addresses at least one failed memory cell of the RAM array.

11. The method of claim 10 further comprising:
receiving a read request including a read address;
providing data in response to the read request, the providing data includes providing data from memory cells of the RAM array that are addressed by the read address;
wherein the data provided also includes data from the redundant RAM array if the received read address addresses at least one failed memory cell of the RAM array.

12. The method of claim 10, wherein the designed cell circuit topology of cells within the redundant RAM array includes a greater number of transistors than the designed cell circuit topology of cells within the RAM array.

13. An integrated circuit, comprising:
a first RAM array including a first plurality of memory cells having a first designed cell circuit topology, the first designed cell circuit topology including a rower supply terminal for being powered by a first power supply voltage, the first RAM array including inputs coupled to address lines to receive an array address for accessing memory cells of the first RAM array;
a second RAM array including a second plurality of memory cells having a second designed cell circuit topology different than the first designed cell circuit topology, the second designed cell circuit topology including a power supply terminal for being powered by a second power supply voltage, the second power supply voltage is different than the first power supply voltage;
wherein the cells of the first RAM array and the second RAM array each include a pair of cross coupled inverters, a first pass gate transistor for coupling the pair of cross coupled inverters to a first bit line which is used for writing data to the cell, and a second pass gate transistor for coupling the pair of cross coupled inverters to a second bit line which is used for writing data to the cell, wherein the second bit line is a complementary bit line to the first bit line; and
access circuitry coupled to the second RAM array, the access circuitry including circuitry which determines when a location in the first RAM array indicated by the received array address includes at least one failed memory cell, and in response to such a determination, the access circuitry accesses at least one memory cell of the second RAM array for providing redundancy for the at least one failed memory cell of the first RAM array.

14. The integrated circuit of claim 13, wherein:
the first RAM array includes inputs for receiving data to be stored at memory cells indicated by an address received on the address lines during a write operation;
the second RAM array stores at least a portion of received data in at least one memory cell during the write operation if the access circuitry determines that the received address includes at least one failed memory cell of the first RAM array.

15. The integrated circuit of claim 13, wherein the second designed cell circuit topology includes a greater number of transistors than the first designed cell circuit topology.

16. The integrated circuit of claim 13, wherein the second designed cell circuit topology includes a different interconnectivity of transistors than the first designed cell circuit topology.

17. The integrated circuit of claim 13, wherein the first designed cell circuit topology includes at least one transistor having a first effective width and the second designed cell circuit topology includes at least one corresponding transistor having a second effective width different from the first effective width.

18. The integrated circuit of claim 13, wherein the first designed cell circuit topology includes at least one transistor having a first effective length and the second designed cell circuit topology includes at least one corresponding transistor having a second effective length different from the first effective length.

19. The integrated circuit of claim 13, wherein the first designed cell circuit topology includes at least one transistor having a first threshold voltage and second designed cell circuit topology includes at least one corresponding transistor having a second threshold voltage different from the first threshold voltage.

20. The integrated circuit of claim 13 wherein the first power supply voltage is less than the second power supply voltage.

* * * * *